United States Patent [19]

Seibel

[11] Patent Number: 4,770,900
[45] Date of Patent: Sep. 13, 1988

[54] PROCESS AND LAMINATE FOR THE MANUFACTURE OF THROUGH-HOLE PLATED ELECTRIC PRINTED-CIRCUIT BOARDS

[75] Inventor: Markus Seibel, Mainz, Fed. Rep. of Germany

[73] Assignee: Hoechst Aktiengesellschaft, Frankfurt am Main, Fed. Rep. of Germany

[21] Appl. No.: 27,121

[22] Filed: Mar. 16, 1987

Related U.S. Application Data

[63] Continuation of Ser. No. 708,800, Mar. 6, 1985, abandoned.

[30] Foreign Application Priority Data

Mar. 9, 1984 [DE] Fed. Rep. of Germany ....... 3408630

[51] Int. Cl.⁴ ............................ B05D 5/12; B44C 1/22; C03C 15/60; C03C 25/06
[52] U.S. Cl. .................................... 427/97; 156/659.1; 156/901; 156/902
[58] Field of Search ............... 427/97; 156/659.1, 901, 156/902

[56] References Cited

U.S. PATENT DOCUMENTS 4,305,975 12/1981 Ikari et al. ............................ 427/97
4,325,780 4/1982 Schulz, Sr. ...................... 156/659.1
4,336,100 6/1982 Passlick ............................. 156/630

FOREIGN PATENT DOCUMENTS 1013606 12/1965 United Kingdom ................ 156/901
1124298 8/1968 United Kingdom .

Primary Examiner—Michael R. Lusignan
Assistant Examiner—Vi Duong Dang
Attorney, Agent, or Firm—Foley & Lardner, Schwartz, Jeffery, Schwaab, Mack, Blumenthal & Evans

[57] ABSTRACT

A process for the manufacture of through-hole plated electric printed-circuit boards is described, in which a board of an insulating material is provided with plated-through holes which are arranged in a grid pattern and the walls of which are coated with a conductive metal layer. The board is covered with a conductive metal layer on at least one side thereof. After metallizing the holes, the metal layer is covered imagewise and the areas of the metal layer which are not covered are either reinforced by metal deposition or removed by etching. Together with the metal layer, part of the holes are covered in such a way that only the required portion of all holes act as conductive connections in the final product. The process of the present invention permits the large-scale manufacture of a predrilled or prepunched and premetallized base material for printed circuits.

21 Claims, 3 Drawing Sheets

PROCESS AND LAMINATE FOR THE MANUFACTURE OF THROUGH-HOLE PLATED ELECTRIC PRINTED-CIRCUIT BOARDS

This application is a continuation of application Ser. No. 708,800, filed Mar. 6, 1985, now abandoned.

BACKGROUND OF THE INVENTION

The present invention relates to a process for the manufacture of through-hole plated electric printed-circuit boards, using a laminate which comprises at least one layer of an insulating material in the form of a board or a web and at least one electrically conductive metal layer and shows a plurality of plated-through holes.

It is known to manufacture circuit boards for printed circuits from a laminate which comprises an insulation board, for example, of a glass-fiber reinforced phenolic resin, and a thin copper layer bonded to it. In the process, the copper layer is covered with a stencil corresponding to the arrangement of the required conductive paths and the copper which has not been covered is removed by etching. In addition to this operating procedure which is called the subtractive method, there is the additive method, in which the surface of the insulation board is provided with noble-metal nuclei and covered in image configuration. Thereafter, the surface which is not covered is metallized in a chemical plating process and, if appropriate, an electroplating process. Moreover, a semiadditive method is customarily used, in which first a continuous, thin conductive copper layer is deposited, then the covering stencil is applied, the areas which lie open are reinforced by electroplating, the stencil is detached and the uncovered areas of the non-reinforced copper layer are etched away (cf. Herrmann, "Handbuch der Leiterplattentechnik" (Manual of Printed-Circuit Board Technique), publishers Eugen G. Leuze-Verlag, Saulgau, Federal Republic of Germany, 2nd edition, 1982).

Up to the present, the holes for through-plating are produced by drilling or punching the boards, corresponding to the required size and number of holes, i.e., holes are provided only in those places where they are needed. Then the walls of the holes are rendered conductive by a preliminary electroless deposition of metal.

These two process steps—drilling or punching of holes and through-plating—are performed according to the presently known and customary processes, in a relatively late stage of printed-circuit board manufacture, i.e., only when the pattern of conductive paths is produced, which corresponds to the desired circuit diagram. Since this is individually done for most types of printed-circuit boards, the numbers of identical boards having the same arrangement of holes are comparatively small; manufacture is thus rendered expensive.

In the processes which are known in the art, the production of holes and the metallization of hole walls represents a critical process stage, which requires a number of preliminary preparation and cleaning steps and must be carried out with particular care to obtain a uniform, uninterrupted metal layer. In the subtractive and semiadditive methods, this is the only stage in which metal must be deposited in an electroless process.

It is known to catalyze the insulating base material throughout, i.e., to incorporate palladium nuclei in its entire mass. As a result, it is possible to place the connection holes in any position and to provide these holes with a conductive metal coating by electroless deposition. By this procedure, the critical step of seeding with metal nuclei and anchoring the nuclei is obviated at the time of application; however, drilling and electroless metallization must still be carried out in this stage of the process. In addition, a substantially higher amount of noble-metal compounds is required to include metal nuclei in the entire mass of the base material.

German Offenlegungsschrift No. 2,453,788 discloses a process for manufacturing printed circuits, in which a base material for circuit boards is used, which has a metal core covered with insulating layers on both sides thereof and to each insulating layer a circuit diagram of copper is applied. To produce the through-connections, holes are provided in the laminate in the required positions and are filled with plugs comprising an insulating plastic material. Through these plugs, holes of smaller diameters are then drilled, such that a continuous wall of the insulating plastic remains. These walls are thereafter coated with a conductive metal layer which establishes the connection between the two surfaces, without producing a conductive connection to the metal core.

A similar process is described in German Auslegeschrift No. 2,739,494. In this process, a number of holes in excess of the through-connections which are subsequently required are produced in the base material, for example, in a grid arrangement, and are filled with an insulating material. When manufacturing the printed-circuit boards at a later time, the plugs of insulating material are drilled out again only in the required positions and the bores so produced are metallized. By arranging the holes according to a grid system it is intended to enable a uniform serial production of the base material used in printed-circuit boards for digital electronics, which comprise several integrated circuits.

In all these processes, however, through-plating of bores can only be effected individually, corresponding to the desired circuit diagram, at the time of manufacturing the printed circuit. This means that the critical stage of metallizing the hole walls, which comprises many steps of preparation and metal deposition, is invariably subject to the technological disadvantages of individual or small-lot production at the processors of the base material.

SUMMARY OF THE INVENTION

It is an object of the present invention to provide a process for the manufacture of through-hole plated printed-circuit boards, in which the critical stages of production of holes for through-plating can be performed on a large, industrial scale.

It is another object of the invention to provide a process in which preparation, cleaning, seeding with metal nuclei, and electroless metallization up to the generation of a continuous metal layer, and especially in the holes of the insulating material, can also be performed on a large, industrial scale.

It is yet another object of the invention to provide a process in which the manufacture of through-hole plated-circuit boards can be performed at a favorable cost.

It is still another object of the invention to make available a support material for the manufacture of printed-circuit boards.

A still further object of the invention is to make available a support material which allows an extensive variation in the layout of conductor paths and through-connections at the time of producing the circuits.

These objects are achieved by a process for the manufacture of through-hole plated electric printed circuit boards comprising the steps of producing holes in a board, web or layer of insulating material, in which the holes are distributed in a regular pattern over the surface of the board. The walls of the holes are metallized, and thereafter a conductive metal layer is deposited on at least one surface of the board. The metal layer is covered imagewise by a stencil, and the areas of the metal layer not covered are either reinforced by metal deposition or removed by etching. The covering stencil is subsequently detached, and the non-reinforced portions of the metal layer removed by etching in the case of reinforcement by metal deposition.

The objects of the invention are also achieved by a laminate used in the manufacture of through-hole plated electric printed-circuit boards, the laminate comprising at least one layer of an insulating material and at least one uninterrupted conductive metal layer. The laminate has a plurality of plated through-holes which are distributed in a regular pattern over the surface of the laminate and are coated with a conductive metal on their inner walls.

BRIEF DESCRIPTION OF THE DRAWINGS

In the drawings:

FIG. 3A shows the copper-clad base material,

FIG. 3B shows the copper-clad base material covered by a photoresist stencil,

FIG. 3C shows the material of FIG. 3B after etching, and

FIG. 3D shows the material of FIG. 3C after stripping the photoresist stencil;

FIG. 4A shows the copper-clad base material covered by a photoresist stencil,

FIG. 4B shows the same material after plating,

FIG. 4C shows the material of FIG. 4B after stripping the photoresist stencil, and FIG. 4D shows the material of FIG. 4C after removing the base copper by etching.

DETAILED DESCRIPTION OF THE PREFERRED EMBODIMENTS

Figure 1:
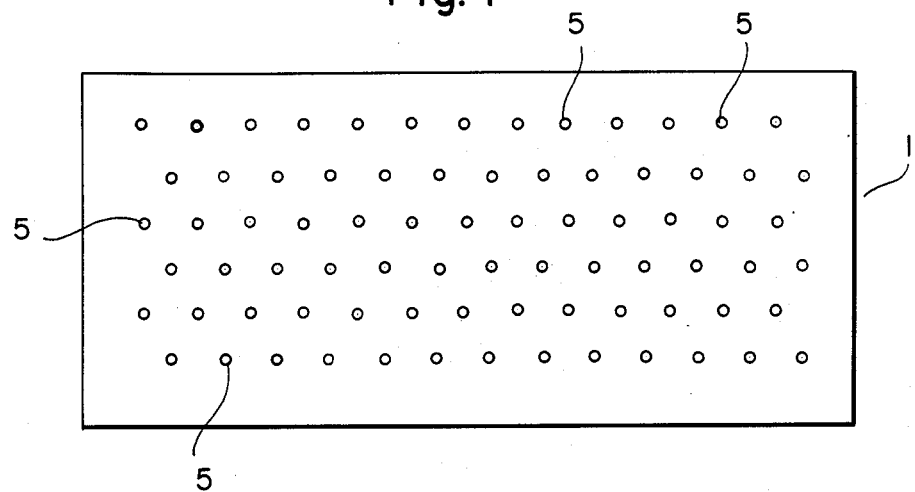
FIG. 1 shows a top view of a copper-clad base material for printed-circuit boards according to the invention.

According to the present invention, a process for the manufacture of through-hole plated electric printed-circuit boards is provided, in which a board, a web or a layer of an insulating material which comprises plated-through holes, the walls of which are coated with a conductive metal, is provided with a conductive metal layer on at least one surface thereof, the metal layer is covered imagewise, and the areas of the metal layer which are not covered are either reinforced by metal deposition or removed by etching. In the case of metal deposition, the covering stencil is subsequently detached and the non-reinforced portions of the metal layer are removed by etching.

In the process of the invention, the holes are produced so as to be distributed in a regular pattern over the surface of the board, the hole walls are metallized before the metal layer is covered imagewise and the metal layer and part of the holes are covered in such a way that only the required portion of the total number of holes act as conductive connections in the final product.

According to the invention, a laminate for use in the manufacture of through-hole plated electric printed-circuit boards is also provided, which comprises at least one layer of an insulating material and at least one uninterrupted conductive metal layer and exhibits a plurality of plated-through holes.

In the laminate of the invention, the plated-through holes are distributed in a regular pattern over the surface of the laminate and are coated with a conductive metal on their inner walls.

Due to the arrangement of pre-punched, plated-through sections and unpunched areas, which is, for example, determined and set-up with the aid of computers, it is possible to pre-fabricate uniform hole patterns which can be used for a great number of different circuits. As a result, the cost of printed-circuit board manufacture is substantially reduced.

In the process of the present invention, it is possible to use a wide variety of insulating substrates, on which conductive circuit patterns can be produced. A suitable insulating substrate comprises, for example, a plastic board, a ceramic plate or a composite structure obtained by laminating superposed layers which have been formed by impregnating a base, for example, comprising glass fibers or paper, with a thermosetting resin. Moreover, the insulating substrate can be produced by applying an insulating layer to the surface of a metal sheet. In fact, it is not necessary for the entire substrate to comprise an insulating material; it is rather sufficient to have a substrate in which at least the surface area exhibits insulating properties.

A layer comprising a resin adhesive is formed on the surface of the insulating substrate. Suitable adhesives include synthetic diene rubbers and rubber-free adhesives. Examples of synthetic diene rubbers which can be used comprise butadiene polymers, butadiene/acrylonitrile copolymers, isoprene rubber, chloroprene rubber, acrylonitrile/butadiene/styrene terpolymers and mixtures of at least two of the above-mentioned synthetic rubbers. It is also possible to admix the synthetic rubber, for example, a rubber of the indicated type, with a thermosetting resin, for example, an epoxy or phenolic resin. By means of the adhesive which contains or comprises the synthetic diene rubber it is later possible to obtain a firm bond between a conductive layer and the substrate. If a thermosetting resin is additionally used, the synthetic diene rubber should be employed in a quantity such that its weight, based on the total quantity of synthetic diene rubber and thermosetting resin, is from about 10% to 70% by weight, preferably about 50% by weight.

In addition to the synthetic rubbers, it is possible to use adhesives comprising, for example, epoxy resins, such as epoxy resins of the bisphenol type, epoxy/novolak resins, alicyclic epoxy resins and mixtures thereof. These epoxy resins permit the manufacture of printed-circuit boards which have excellent electrical properties.

Suitable adhesives of the above-indicated types can contain inorganic fillers, such as silica gel, zirconium silicate or magnesium silicate, which act as reinforcing agents. Based on the total quantity of resin, the quantity of inorganic filler may amount to 3% to 50%. If the adhesive composition contains a thermosetting resin, it can additionally be admixed with a hardening agent, for example, an amine or an acid anhydride. In addition, a pigment can be incorporated in the adhesive composition.

The adhesive layer is treated with an oxidizing agent to render it receptive to the subsequent metallizing operations. Treating with an oxidizing agent serves, in particular, to roughen the surface of the adhesive layer, since it is etched. Moreover, the adhesive layer is rendered hydrophilic. Oxidizing agents which can be used include, for example, chromic acid, salts of chromic acid, permanganate, mixtures of chromic acid and sulfuric acid. Especially mixtures of chromic acid and sulfuric acid make it possible to obtain a firm bond between the subsequently formed conductive circuit pattern and the adhesive layer.

After treating with an oxidizing agent, the surface of the adhesive layer is activated to permit metal deposition in the following electroless metallization.

Palladium which acts as a catalyst or activator in the electroless metallizations is, in particular, deposited on the surface of the adhesive layer for activating purposes. In the activating treatment, the substrate is, for example, immersed in a solution which contains palladium chloride and stannous chloride and has been acidified by adding hydrochloric acid. It is also possible to contact the substrate surface with a stannous chloride solution which has been acidified by adding hydrochloric acid and thereafter with a palladium chloride solution. On the other hand, the substrate surface can also be contacted with a solution of an organic palladium complex and is then treated with a weak reducing agent, in order to deposit metallic palladium on the surface of the adhesive layer. By the deposited palladium, i.e., the catalyst, an adequate deposition of the desired metal is rendered possible in the following electroless metallization.

The substrate surface is then subjected to an electroless metallization process. Baths which can be used in this process include, for example, copper, nickel or gold baths. A copper bath for electroless copper-plating comprising, for example, copper sulfate, ethylene diamine tetraacetate or Rochelle salt and formaldehyde is particularly suitable. If necessary, the bath can be admixed with sodium hydroxide, dipyridyl, polyethylene oxide and the like. As a rule, the bath is maintained at a temperature in the range from 50° C. to 78° C. During electroless metallization, the pH of the bath is adjusted to about 12.0 to 13.0.

In the process of the present invention, it is preferred to coat both sides of the insulating material with a conductive metal layer, particularly a copper layer. The thickness of the metal layer depends on the intended further processing. If the material is processed according to the semiadditive method, the nature of the layer must be such that it is contiguous and permits electroless deposition or preferably electrodeposition of homogeneous and flawless metal layers in any desired thickness. Layer thicknesses from about 0.1 to 5 $\mu$m, preferably from 0.2 to 3 $\mu$m are generally sufficient for this purpose.

If the material is to be further processed according to the subtractive method by the manufacturers of printed-circuit boards, the layer thickness, in general, can be from 5 to 100 $\mu$m, preferably from 10 to 70 $\mu$m.

According to the invention, it is also possible, especially in the case of great layer thicknesses, to use a base material which is copperclad on one or both sides. This base material is provided with holes and the hole walls are then copperplated, while the layers can also be reinforced, at the same time.

It is particularly advantageous to combine the process of the present invention with the semiadditive or subtractive operating method.

After drilling or punching the holes, the surface of the insulating material is appropriately prepared for chemical plating and, if appropriate, electroplating, by cleaning, slight etching, seeding with metal nuclei, etc., as is known in the art, since at this point of the process, the indicated steps can be carried out in an economical manner. In the preparation procedure, firmly bonded noble metal nuclei, for example, palladium or silver nuclei, are generated, as described, for example, in German Offenlegungsschrift No. 1,696,603 and in U.S. Pat. No. 3,632,388, and a contiguous metal layer is then deposited at these nuclei in an electroless process.

After production by the manufacturer of raw materials for printed-circuit boards, the laminate according to the present invention is supplied to the manufacturer of printed-circuit boards, appropriately in the form of large sizes or rolls, and is then further processed. In the processing procedure, the metal layer, particularly the copper layer, is covered with a stencil corresponding to the configuration of the desired circuit pattern, as is known in the art. The stencil can be applied in a known manner by screenprinting or according to the photoresist process. Appropriately, a process is chosen, which permits complete covering of the holes. A dry-photoresist is, for example, suitable for use in this operating procedure called "tenting technique".

The dry-resist layer is laminated to the copper layer such that all holes are covered. Then the resist layer is exposed under a circuit pattern which reproduces the desired conductive paths and the platedthrough holes which are required. Following exposure, the resist layer is developed to form a stencil and the uncovered copper is etched (subtractive method) or reinforced by electroplating and, if appropriate, additionally coated with an electroplate comprising a lead-tin alloy (semiadditive method). The resist stencil is removed by decoating and—in the semiadditive method—the basic copper is etched away on the surface and also in the holes. In the etching process, it is not necessary to remove the entire basic copper. It is sufficient to separate the non-required areas of the basic copper from the conductive paths and plated-through holes by etching interstices. This can advantageously be done by covering again with a suitable photoresist stencil. It is also possible to carry out this separation between conductive areas and "blind areas" prior to electroplating and then reinforce even the blind areas by electroplating. This variant has the advantage that the additional cladding with metal produces a better dissipation of heat in the subsequent treatment stages, for example, when soldering. Dissipation of heat is particularly effective if the insulating material used has a metal core. Moreover, the above-described "separative etching" has the advantage that substantially reduced quantities of spent etching baths containing copper ions are obtained during processing. Exposure under the original must be performed in register with respect to the position of the holes. This can be achieved by providing markings at the margin of the board and locating the holes starting from these markings.

It is an advantage of the process according to the present invention that a number of critical, time-consuming and polluting process steps are shifted from the manufacturer of printed-circuit boards, i.e., from the individual processing of boards in their final sizes, to the manufacturer of the raw materials for printed-circuit boards, i.e., to large scale production. Metal-coated base materials of improved quality and uniformity can thus more economically be manufactured. In addition, spent baths and cleaning solutions can more easily and safely be disposed of.

Only few etching or electroplating stages which are readily controlled and in which only very small quantities of spent baths are obtained are left to be carried out by the user of the novel metal-coated base materials.

By means of the prefabricated base material, a great number of different-type printed-circuit boards can be manufactured in a simple manner, even in small lots.

In FIG. 1 of the accompanying drawings, a base material 1 for printed-circuit boards is shown, having a number of metallized through-holes 5 which are distributed in a regular pattern over the surface of the board.

Figure 2:
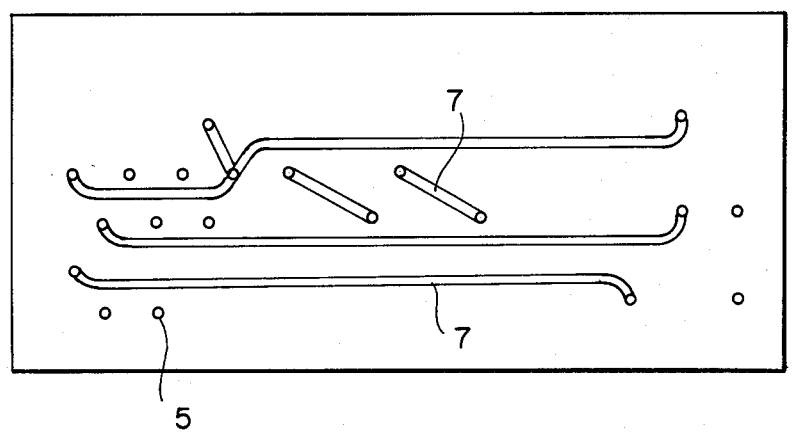
FIG. 2 shows a printed circuit prepared from a base material according to the invention.

FIG. 2 shows a printed circuit prepared from the base material of FIG. 1. Some of the metallized through-holes 5 have been retained as conducting through-connections and some are connected by conductive copper paths 7. The remainder of the through-holes, which are not shown in the drawing, have been rendered ineffective by etching away the copper layer.

Figure 3A:
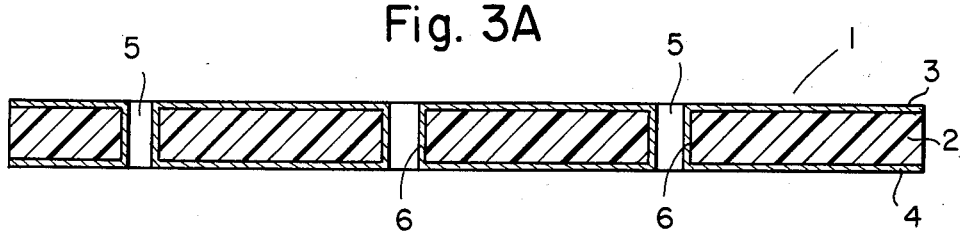
FIGS. 3A to 3D are cross-sectional views of a printed-circuit board according to the invention, during several steps of the subtractive method.
Figure 3B:
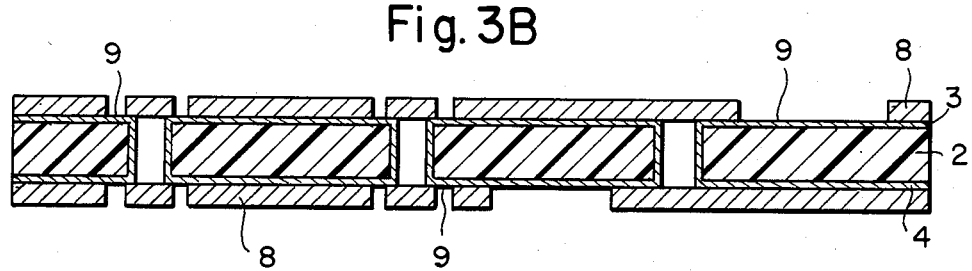
Figure 3C:
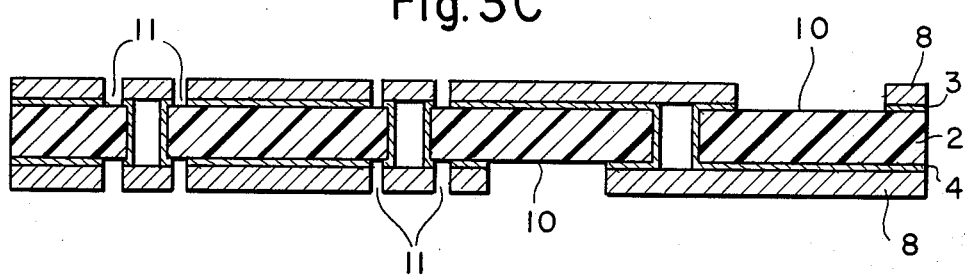
Figure 3D:
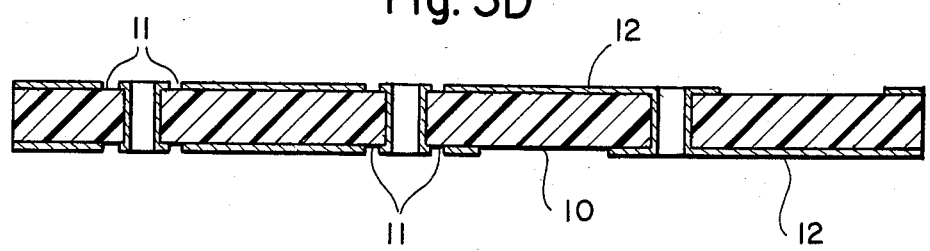

FIGS. 3A to 3D demonstrate the manufacture of a printed circuit according to the subtractive method. FIG. 3A shows a cross-sectional view of a base material according to the invention. An insulating board 2 carries upper and lower conductive metal layers 3 and 4. The board is provided with regularly arranged holes 5, the walls of which are covered by copper layers 6. In FIG. 3B, the base material of FIG. 3A is covered patternwise on both sides with a photoresist stencil 8 which covers the copper areas to be retained in the final printed circuit. Reference numeral 9 denotes the exposed areas of the copper layer. In FIG. 3C, the copper has been removed by etching in the areas marked 10 and 11. FIG. 3D shows the circuit board after stripping the photoresist stencil. The through-holes 5 which are not required as conducting through-connections are separated from the remaining copper by annular etched spaces 11 around each hole, while the copper areas 12 are conductively connected by an unseparated through-hole copper layer.

Figure 4A:
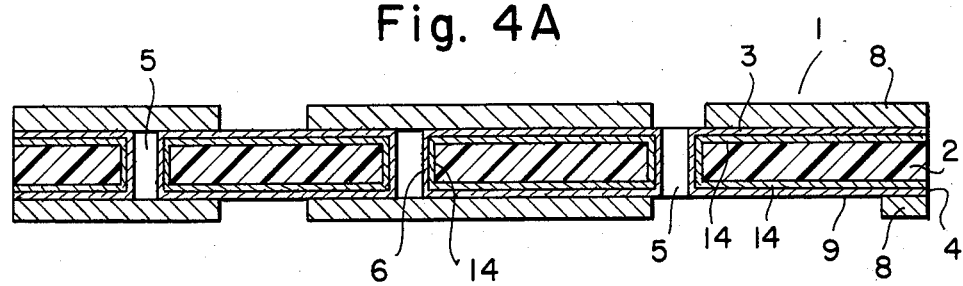
FIGS. 4A to 4D are cross-sectional views of a printed-circuit board according to the invention, during several steps of the semiadditive method.
Figure 4B:
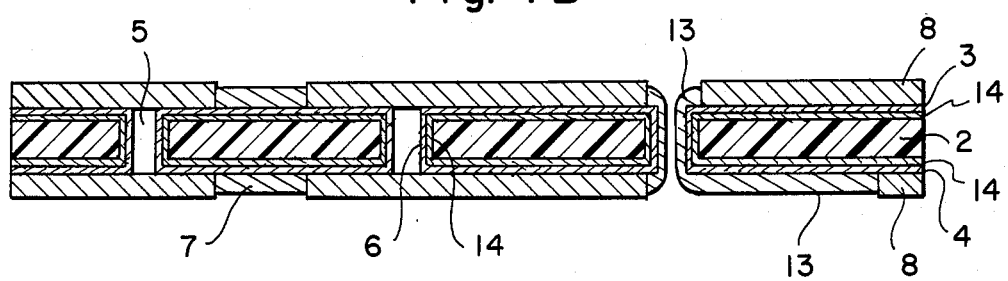
Figure 4C:
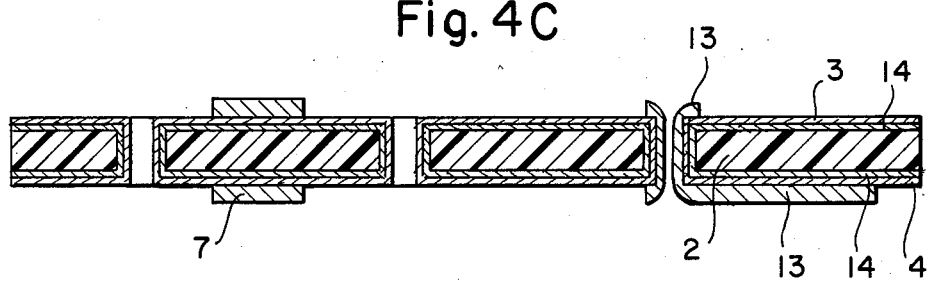
Figure 4D:
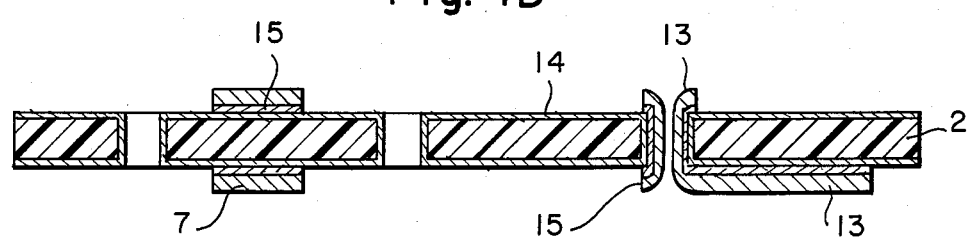

FIGS. 4A to 4D demonstrate the manufacture of a printed circuit according to the semiadditive method. In FIG. 4A, a base material for printed circuit boards 1 is shown, which comprises an insulating board 2 with through holes 5. The main surfaces and the hole walls are covered by an adhesive layer 14, the adhesive layer being covered by copper layers 3 and 4 on the upper and lower main surfaces and by copper layers 6 on the hole walls. The upper and lower surfaces are additionally covered patternwise by a photoresist stencil 8 which leaves parts 9 of the copper layer uncovered. FIG. 4B shows the base material of FIG. 4A after metal plating. There are conductive paths 7 without through-connections and areas 13 which are through connected. FIG. 4C shows the circuit board of FIG. 4B after stripping the photoresist stencil. In FIG. 4D, the final printed circuit is shown, in which the base copper areas not covered by conductive paths 7 or areas 13 have been removed by etching. Beneath these conductive paths, copper areas 15 have been retained.

The following examples illustrate preferred embodiments of the invention.

EXAMPLE 1

A 2 mm thick board of a glass-fiber reinforced epoxy resin is coated with a commercial adhesion-promoting layer which is then cured. Thereafter regularly arranged holes of 1 mm diameter and with spaces of 2.5 mm between them are drilled in the board. Markings, for example, pilot holes, which correspond to the position of the rows of holes are provided at the edges of the board to serve as reference points for locating the holes.

The plate surface is then slightly etched with chromosulfuric acid, cleaned, decontaminated and neutralized, sensitized by means of a palladium chloride solution and activated with a stannous chloride solution. From a customary electroless copper bath, an about 0.3 $\mu$m thick copper layer is then deposited at the palladium nuclei so produced. The board can be stored and transported to the processing plant in this form.

To manufacture a printed-circuit board, a negative dry-resist film is laminated to both sides of the board, using a commercial laminator. Each dry-resist layer is exposed under a positive original of a circuit pattern, in the usual manner, the support films are peeled from the resist layers and the layers are developed with an aqueous-alkaline solution, such that the unexposed layer areas are rinsed off. At the uncovered conductive paths and holes, the copper layer is then reinforced to about 50 $\mu$m by electroplating in a commercial copper bath. Thereafter, a commercial lead-tin bath is used to electrodeposit an about 10 $\mu$m thick layer of a lead-tin alloy on the copper. The resist stencil is removed and the basic copper which is thereby uncovered is etched away.

EXAMPLE 2

An 0.5 mm thick aluminum sheet is provided with a grid of holes by punching-in the holes. The holes have a diameter of 1 mm and are spaced 2.5 mm (between hole edges). The burrs produced by punching are removed by brushing and the residues of the oil used in the punching process are washed off with a solvent.

The sheet is then pickled in an alkaline solution, electrolytically roughened and anodically oxidized to form an oxide layer of 4g/m$^2$. The oxide layer is sealed by immersion in hot water.

The cleaned aluminum sheet is coated with an epoxy-resin lacquer (approximately 50g/m$^2$ on either side) which is then cured. The insulating lacquer is applied such that even the walls of the punched holes are continuously covered.

Chemical metallization is carried out as described in Example 1.

The board is now coated with an about 0.3 $\mu$m thick uninterrupted copper layer on its entire surface including the hole walls. Processing into a printed circuit is effected as described in Example 1.

What is claimed is:

1. A process for the manufacture of a through-hole plated electric printed-circuit board, comprising the steps of:

(a) producing through holes in a board or sheet of metal, said holes being distributed in a regular pattern over the surface of the board;

(b) coating the entire surface of both sides of said board, including all hole walls, with a layer of insulating material;

(c) after step b, coating the entire surface of said layer of insulating material with a conductive metal layer;

(d) covering the metal layer imagewise by a stencil according to a desired pattern to produce conductive and non-conductive portions on the printed-circuit board, whereby said holes are selectively covered to produce a set of first holes which are to act as conductive connections in the printed-circuit board and a set of second holes which do not act as conductive connections in the printed circuit board; and (e) subsequently selectively removing said conductive metal layer by etching to produce said non-conductive portions and to produce said second holes;

wherein said board or sheet of metal allows heat dissipation.

2. A process for the manufacture of a through-hole plated electric printed-circuit board, comprising the steps of:

(a) producing through holes in a board, web or layer of insulating material, said holes being distributed in a regular pattern over the surface of the board;

(b) after step a), coating the entire surface of both sides of said board, including all hole walls, with a conductive metal layer;

(c) covering the metal layer imagewise by a stencil according to a desired pattern wherein the pattern of said stencil covers the conductive portions on the printed-circuit board to produce conductive and non-conductive portions on the printed-circuit board, whereby said holes are selectively covered to produce a set of first holes which are to act as conductive connections in the printed-circuit board and a set of second holes which do not act as conductive connections in the printed circuit board; and (d) subsequently selectively removing the portions of said conductive metal layer uncovered by said stencil by etching to produce said non-conductive portions and to produce said second holes.

3. A process as claimed in claim 2, wherein said first holes are covered by said stencil.

4. A process as claimed in claim 3, wherein at least a portion of said second holes are covered by said stencil and wherein said stencil leaves an annular uncovered portion around each of said covered second holes, wherein said conductive metal underlying the portions of said second holes covered by said stencil allows heat dissipation.

5. A process as claimed in claim 1, wherein said conductive portions include circuit portions and non-circuit portions, and wherein said covering step comprises covering said non-circuit portions and leaving an uncovered portion surrounding each of said non-circuit portions, wherein said conductive metal underlying said covered non-circuit portions allows heat dissipation.

6. A process as claimed in claim 1, wherein the pattern of said stencil leaves uncovered said conductive parts and said first holes, and further comprising, before step (d), the steps of selectively reinforcing the uncovered parts by metal deposition thereon, and removing said stencil, whereby the unreinforced metal layer is selectively removed by said etching.

7. A process as claimed in claim 6, wherein said second holes are covered by said covering step and the metal layer on the hole walls is selectively removed by said etching.

8. A process for the manufacture of a through-hole plated electric printed-circuit board, comprising the steps of:

(a) producing through holes in a board, web or layer of insulating material, said holes being distributed in a regular pattern over the surface of the board;

(b) after step a), coating the entire surface of both sides of said board, including all hole walls, with a conductive metal layer;

(c) covering the metal layer imagewise by a stencil according to a desired pattern to produce conductive and non-conductive portions on the printed-circuit board, whereby said holes are selectively covered to produce a set of first holes which are to act as conductive connections in the printed-circuit board and a set of second holes which do not act as conductive connections in the printed circuit board; and (d) subsequently selectively removing said conductive metal layer by etching to produce said non-conductive portions and to produce said second holes, wherein said conductive portions include circuit portions and non-circuit portions, and wherein said covering step comprises covering a portion surrounding each of said non-circuit portions, wherein said conductive metal underlying said covered non-circuit portions allows heat dissipation.

9. A process as claimed in claim 1, wherein said coating step comprises forming an adhesive layer on the surface of the insulating material, treating said adhesive layer with an oxidizing agent, and activating the surface of the adhesive layer to permit deposition of the conductive metal layer.

10. A process as claimed in claim 1, wherein the surface of the board of insulating material consists essentially of an insulating material.

11. A process for the manufacture of a through-hole plated electric printed-circuit board, comprising the steps of: imagewise covering a metal layer on the surface of a board of insulating material which has through-holes distributed in a regular pattern over the surface thereof and a coating of a conductive metal layer over the entire surface of both sides of the board, including all hole walls, said covering being accomplished by a stencil according to a desired pattern to produce conductive and non-conductive portions on the printed-circuit board, whereby said holes are selectively covered to produce a set of first holes which are to act as conductive connections in the printed-circuit board and a set of second holes which do not act as conductive connections in the printed circuit board, and subsequently selectively removing said conductive metal layer by etching to produce said non-conductive portions and to produce said second holes.

12. A process as claimed in claim 11, wherein the pattern of said stencil covers the conductive portions on the printed circuit board, and the portions uncovered by said stencil are removed in said etching step.

13. A process as claimed in claim 12, wherein said first holes are covered by said stencil.

14. A process as claimed in claim 13, wherein at least a portion of said second holes are covered by said stencil and wherein said stencil leaves an annular uncovered portion around each of said covered second holes, wherein said conductive metal underlying the portions of said second holes covered by said stencil allows heat dissipation.

15. A process as claimed in claim 11, wherein said conductive portions include circuit portions and non-circuit portions, and wherein said covering step comprises covering said non-circuit portions and leaving an uncovered portion surrounding each of said non-circuit portions, wherein said conductive metal underlying said covered non-circuit portions allows heat dissipation.

16. A process as claimed in claim 11, wherein the pattern of said stencil leaves uncovered said conductive parts and said first holes, and further comprising before said removing step the steps of selectively reinforcing the unconverted parts by metal deposition thereon, and removing said stencil, whereby the unreinforced metal layer is selectively removed by said etching.

17. A process as claimed in claim 16, wherein said second holes are covered by said covering step and the metal layer on the hole walls is selectively removed by said etching.

18. A process for the manufacture of a through-hole plated electric printed-circuit board, comprising the steps of:

imagewise covering a metal layer on the surface of a board of insulating material which has through-holes distributed in a regular pattern over the surface thereof and a coating of a conductive metal layer over the entire surface of both sides of the board, including all hole walls, said covering being accomplished by a stencil according to a desired pattern to produce conductive and non-conductive portions on the printed circuit board, whereby said holes are selectively covered to produce a set of first holes which are to act as conductive connections in the printed-circuit board and a set of second holes which do not act as conductive connections in the printed-circuit board; and subsequently selectively removing said conductive metal layer by etching to produce said non-conductive portions and to produce said second holes, wherein said conductive portions include circuit portions and non-circuit portions, and wherein said covering step comprises covering a portion surrounding each of said non-circuit portions, and wherein said conductive metal underlying said covered non-circuit portions allows heat dissipation.

19. A process as claimed in claim 11, wherein said coating step comprises forming an adhesive layer on the surface of the insulating material, treating said adhesive layer with an oxidizing agent, and activating the surfaceof the adhesive layer to permit deposition of the conductive metal layer.

20. A process as claimed in claim 11, wherein the surface of the board of insulating material consists essentially of an insulating material.

21. A process as claimed in claim 11, wherein said through-holes are distributed in a standard pattern universally suitable for production of circuit-boards having different circuit configurations.

* * * * *